(12) United States Patent
Morrell

(10) Patent No.: US 8,299,791 B2
(45) Date of Patent: Oct. 30, 2012

(54) SLICE SELECTIVE MRI EXCITATION WITH REDUCED POWER DEPOSITION USING MULTIPLE TRANSMIT CHANNELS

(75) Inventor: Glen Morrell, Sandy, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 13/433,214

(22) Filed: Mar. 28, 2012

(65) Prior Publication Data

US 2012/0187947 A1 Jul. 26, 2012

Related U.S. Application Data

(63) Continuation of application No. 12/398,982, filed on Mar. 5, 2009, now Pat. No. 8,169,219.

(60) Provisional application No. 61/034,113, filed on Mar. 5, 2008.

(51) Int. Cl.
*G01V 3/00* (2006.01)
(52) U.S. Cl. .................................. 324/314; 324/309
(58) Field of Classification Search .............. 324/314, 324/309, 307, 318, 322
See application file for complete search history.

(56) References Cited

U.S. PATENT DOCUMENTS

| 4,868,501 | A | 9/1989 | Conolly |
| 6,456,071 | B1 * | 9/2002 | Hennig ..................... 324/307 |
| 6,759,847 | B2 | 7/2004 | Brinker et al. |
| 6,989,673 | B2 | 1/2006 | Zhu |
| 7,633,293 | B2 | 12/2009 | Olson et al. |
| 7,894,874 | B2 * | 2/2011 | Lynch et al. ............... 600/407 |

OTHER PUBLICATIONS

Alsop DC, et al. "A Spiral Volume Coil for Improved RF Field Homogeneity at High Static Magnetic Field Strength", Magn Reson Med 1998; 40(1): 49-54.
Foo TK, et al., "Reduction of RF Penetration Effects in High Field Imaging" Magn Reson Med 1992; 23(2): 287-301.

* cited by examiner

*Primary Examiner* — Louis Arana
(74) *Attorney, Agent, or Firm* — McDermott Will & Emery LLP; James W. Hill; Eugene R. Worley

(57) ABSTRACT

Described are embodiments for slice-selective excitation for MRI that utilize multiple RF transmit coils, each of which are driven with a separate independent current waveform. These embodiments allow slice-selective excitation with slice profile and excitation time similar to other single-channel excitation, but with reduction in SAR caused by the transverse component of the RF field by a factor up to the number of excitation coils.

20 Claims, 20 Drawing Sheets

SLICE SELECTIVE MRI EXCITATION WITH REDUCED POWER DEPOSITION USING MULTIPLE TRANSMIT CHANNELS

RELATED APPLICATIONS

This application is a continuation of U.S. patent application Ser. No. 12/398,982 filed Mar. 5, 2009, issued as U.S. Pat No. 8,169,219 on May 1, 2012, which claims priority benefit of U.S. Provisional Application No. 61/034,113, filed Mar. 5, 2008, the entire contents of which are incorporated herein by reference.

GOVERNMENT LICENSE RIGHTS

The U.S. Government has a paid-up license in this invention and the right in limited circumstances to require the patent owner to license others on reasonable terms as provided for by the terms of Grant No. CA112449-02 awarded by the National Institutes of Health.

FIELD OF THE INVENTIONS

This disclosure relates to magnetic resonance imaging (MRI), and in particular to slice-selective excitation for MRI that utilizes multiple radio-frequency (RF) transmit coils.

BACKGROUND OF THE INVENTIONS

Magnetic resonance imaging (MRI) is a common modality for imaging joints and other parts of the body due to its excellent definition of ligaments, cartilage, bone, muscle, fat and superior soft tissue contrast. Many MR techniques have been able to provide information about late stages of degeneration in which structural defects are present.

When a substance, such as human tissue, is subjected to a uniform magnetic field, the individual magnetic moments of the spins in the tissue attempt to align with this polarizing field, but precess about it in random order at their characteristic Larmor frequency. If the substance, or tissue, is subjected to a magnetic field that is in the x-y plane, and which is near the Larmor frequency, the net aligned moment, or "longitudinal magnetization," may be rotated, or "tipped," into the x-y plane to produce a net transverse magnetic moment. A signal is emitted by the excited spins after the excitation signal is terminated, and this signal may be received and processed to form an image.

When utilizing these signals to produce images, magnetic field gradients are employed. Often, the region to be imaged is scanned by a sequence of measurement cycles in which these gradients vary according to the particular localization method being used. The resulting set of received nuclear magnetic resonance (NMR) signals are digitized and processed to reconstruct the image using a reconstruction technique.

SUMMARY OF THE INVENTIONS

Disclosed are embodiments of slice selective excitation that utilize multiple RF transmit coils. In some embodiments, each coil is driven by a separate independent control channel, which achieves slice selection with markedly decreased specific absorption rate (SAR), which is a measure of patient heating. Reduced SAR is achieved, in embodiments described herein, with little or no change in slice profile and little or no significant increase in excitation time.

In some embodiments, methods and apparatus are described for reducing a specific absorption rate (SAR) over a field of view of an imaged object during magnetic imaging (MRI). Some embodiments include the steps of emitting a first radiofrequency (RF) pulse into an object with an RF excitation coil element that has a first sensitivity profile comprising (a) a substantially uniform amplitude, and (b) a first phase that is substantially constant in a direction across an imaging volume of the object; emitting a second RF pulse into the object with a second RF excitation coil element that has a second sensitivity profile comprising (a) a substantially uniform amplitude, and (b) a second phase that varies substantially linearly, with a first nonzero integer multiple of $2\pi$ phase variation, in the direction across the imaging volume; and emitting a third RF pulse into the object with a third RF excitation coil element that has a third sensitivity profile comprising (a) a substantially uniform amplitude and (b) a third phase that varies substantially linearly, with a second nonzero integer multiple of $-2\pi$ phase variation, in the direction across the imaging volume.

In some embodiments, an improved SAR, resulting from emission of the first, second, and third RF pulses over a field of view of the object, is decreased relative to an unimproved SAR, resulting from emission of a fourth RF pulse that would produce substantially the same amount of transverse magnetization as emission of the first, second, and third RF pulses over the field of view.

Some embodiments provide that RF pulses are emitted into the object by n RF coil elements, and in certain embodiments, $n \geq 3$. In some embodiments, the improved SAR is reduced by about a factor of n relative to the unimproved SAR. In some embodiments, the first and second nonzero integers are positive integers. Some embodiments provide that the first and second nonzero integers are the same positive integer. In certain embodiments, the first phase is substantially zero across the imaging volume. In some embodiments, each of the first, second, and third RF pulses comprises a waveform that is substantially identical in shape to, but shifted in time relative to, each of the others of the first, second, and third waveforms.

Some embodiments provide methods for reducing a specific absorption rate (SAR) over a field of view of an imaged object during magnetic imaging (MRI) that include emitting a first radiofrequency (RF) pulse into an object with an RF excitation coil element that has a first sensitivity profile comprising a first phase that is substantially constant across an imaging volume of the object; emitting a second RF pulse into the object with a second RF excitation coil element that has a second sensitivity profile comprising a second phase that varies substantially linearly, with a first nonzero integer multiple of $2\pi$ phase variation, in a direction across the imaging volume; and emitting a third RF pulse into the object with a third RF excitation coil element that has a third sensitivity profile comprising a third phase that varies substantially linearly, with a second nonzero integer multiple of $-2\pi$ phase variation, in the direction across the imaging volume.

In some embodiments, an improved SAR, resulting from emission of the first, second, and third RF pulses over a field of view of the object, is decreased relative to an unimproved SAR, resulting from emission of a fourth RF pulse that would produce substantially the same amount of transverse magnetization as emission of the first, second, and third RF pulses over the field of view.

In some embodiments, RF pulses are emitted into the object by n RF coil elements, and in certain embodiments, $n \geq 3$. In some embodiments, RF pulses are transmitted via n RF channels, and in certain embodiments, $n \geq 3$. Some embodiments provide that the improved SAR varies spatially across the field of view. In some embodiments, the improved SAR is reduced by about a factor of n relative to the unimproved SAR.

Some embodiments provide that the first and second nonzero integers are positive integers. In some embodiments, the first and second nonzero integers are the same positive integer. In certain embodiments, the first phase is substantially zero across the imaging volume. Some embodiments, provide that each of the first, second, and third RF pulses comprises a waveform that is substantially identical in shape to, but shifted in time relative to, each of the others of the first, second, and third waveforms.

Some embodiments described herein relate to a system, for reducing a specific absorption rate (SAR) over a field of view of an imaged object during magnetic imaging (MRI), that includes a transmit module. In some embodiments, the transmit module is programmed to emit a first radiofrequency (RF) pulse into an object with an RF excitation coil element that has a first sensitivity profile comprising a first phase that is substantially constant across an imaging volume of the object; emit a second RF pulse into the object with a second RF excitation coil element that has a second sensitivity profile comprising a second phase that varies substantially linearly, with a first nonzero integer multiple of $2\pi$ phase variation, in a direction across the imaging volume; and emit a third RF pulse into the object with a third RF excitation coil element that has a third sensitivity profile comprising a third phase that varies substantially linearly, with a second nonzero integer multiple of $-2\pi$ phase variation, in the direction across the imaging volume. In some embodiments, an improved SAR, resulting from emission of the first, second, and third RF pulses over a field of view of the object, is decreased relative to an unimproved SAR, resulting from emission of a fourth RF pulse that would produce substantially the same amount of transverse magnetization as emission of the first, second, and third RF pulses over the field of view.

For purposes of summarizing the disclosure, certain aspects, advantages, and novel features of the disclosure have been described herein. It is to be understood that not necessarily all such advantages may be achieved in accordance with any particular embodiment of the disclosure. Thus, the disclosure may be embodied or carried out in a manner that achieves or optimizes one advantage or group of advantages as taught herein without necessarily achieving other advantages as may be taught or suggested herein.

BRIEF DESCRIPTION OF THE DRAWINGS

General descriptions provided herein that implement various features of the disclosure will now be described with reference to the drawings. The drawings and the associated descriptions are provided to illustrate embodiments of the disclosure and not to limit the scope of the disclosure.

DETAILED DESCRIPTION OF THE INVENTIONS

Described herein are embodiments for slice-selective excitation for MRI that utilize multiple RF transmit coils, each of the coils being driven with a separate independent current waveform. These embodiments allow slice-selective excitation with slice profile and excitation time similar to conventional single-channel excitation but with reduction in SAR caused by the transverse component of the RF field by a factor up to the number of excitation coils.

Results described herein are based on numerical integration of the Bloch equation, neglecting T1 and T2 relaxation. Transverse SAR was calculated by summing over time the square amplitude of the transverse component of the RF field B1 at each spatial location, which depends on the individual RF waveforms and coil sensitivity profiles.

Conventional Slice-Selective Excitation

Slice-selective excitation is achieved by applying a current to the RF excitation coil which is modulated at the proton resonant frequency (64 MHz for a 1.5 Tesla main field strength), with a time envelope which is approximately equal to the Fourier transform of the desired slice profile. A constant gradient field is applied during the excitation process. The direction of the gradient determines the orientation of the selected slice, and the gradient strength determines the thickness of the slice profile. Excitation is typically performed with a coil designed for optimal field uniformity.

Figure 1A:
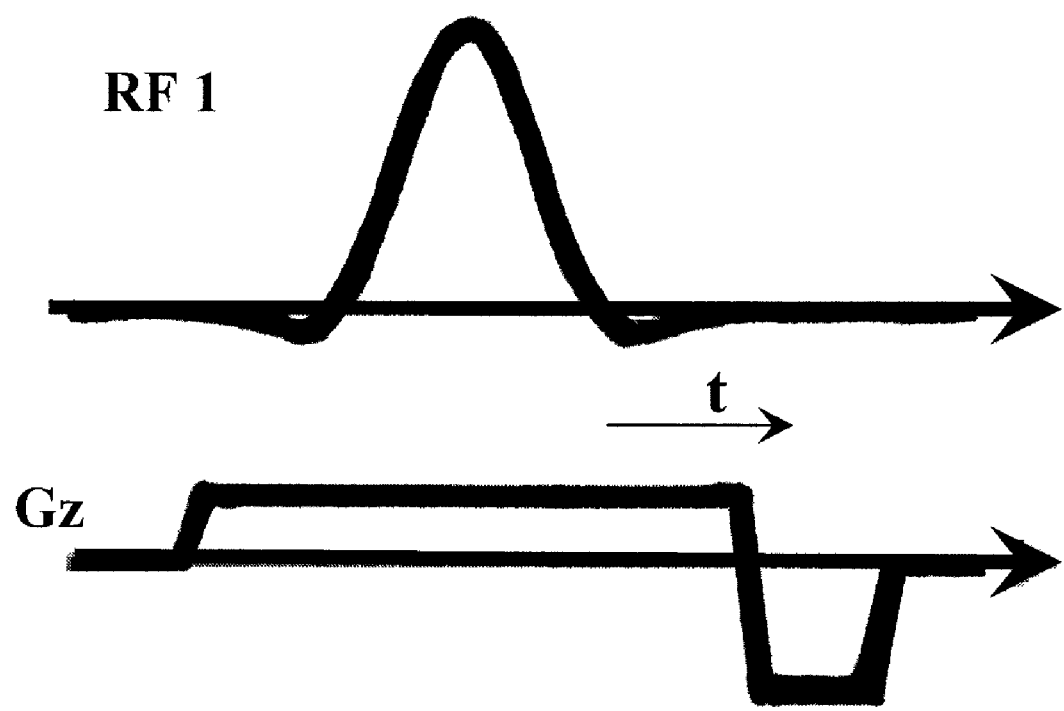
FIG. 1A depicts a RF envelope and z gradient current waveforms of a slice-selective excitation.
Figure 1B:
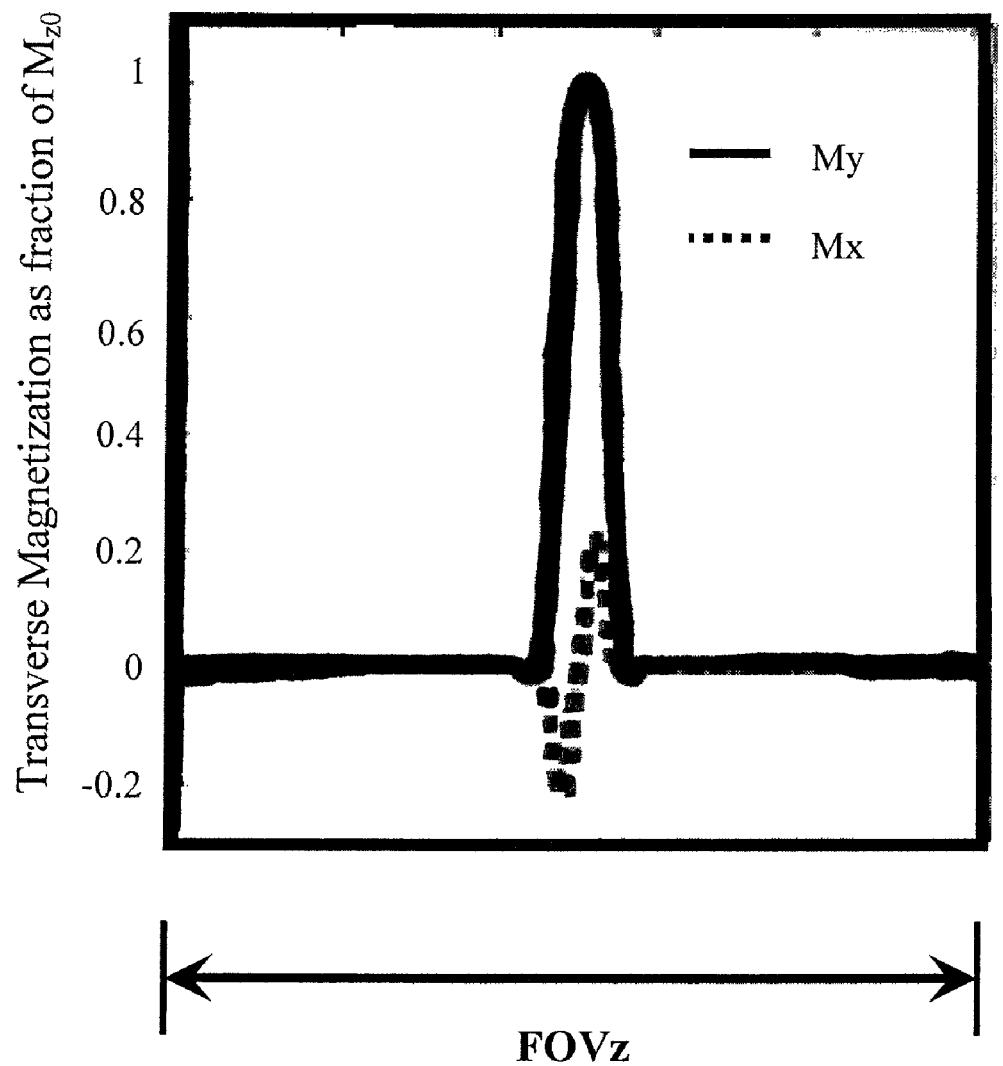
FIG. 1B depicts a slice profile in z, assuming uniform RF coil sensitivity.
Figure 1C:
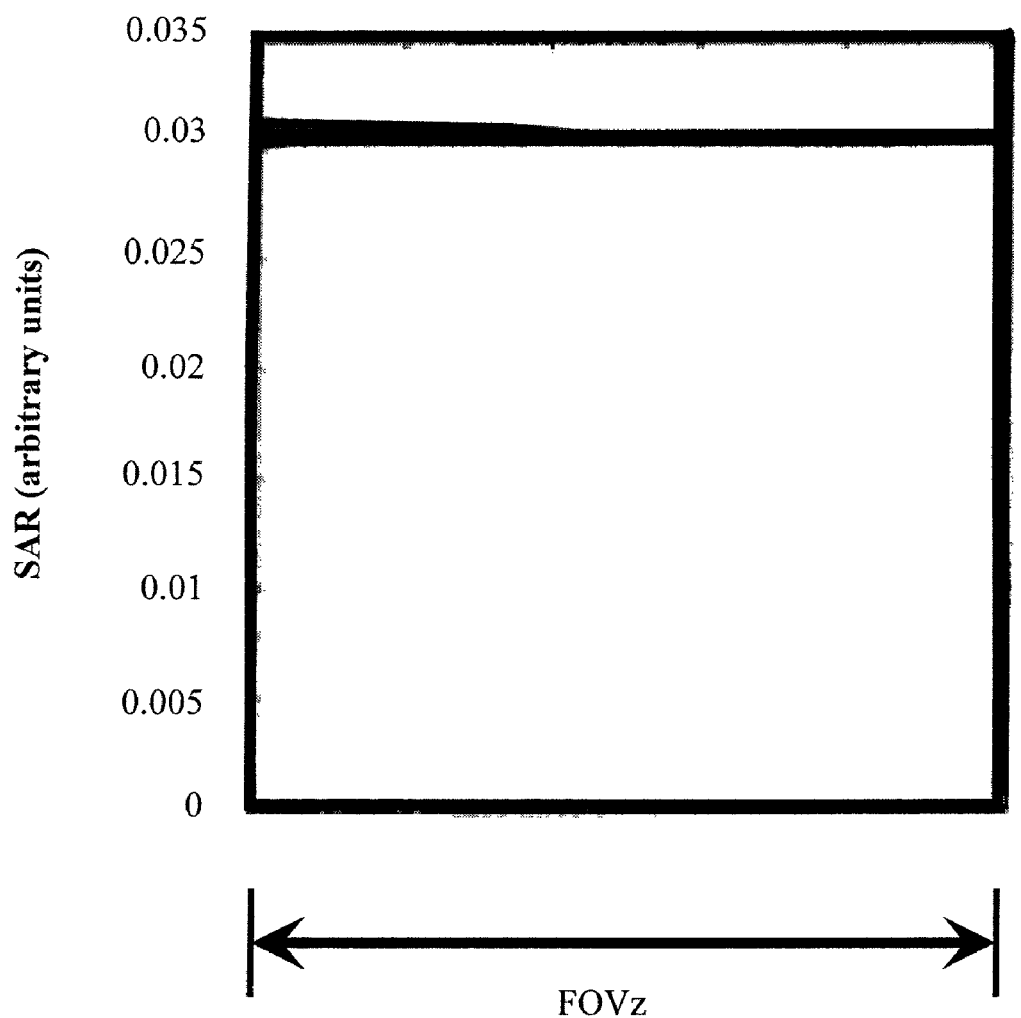
FIG. 1C depicts the SAR resulting from the transverse component of B1.

FIGS. 1A-1C depict a conventional slice-selective excitation. FIG. 1A depicts RF envelope and z gradient current waveforms. The RF envelope was designed by Fourier transform with Hamming window. FIG. 1B depicts a slice profile in z, assuming uniform RF coil sensitivity. Units are fraction of maximum possible transverse magnetization $M_{zo}$. FIG. 1C depicts the SAR resulting from the transverse component of B1. For conventional slice selection, the SAR is constant across the field of view, whether in or out of slice.

With a substantially uniform RF field, the SAR of a conventional slice-selective pulse is the same over the entire sensitive volume of the coil. Areas both within and without the selected slice experience the same RF field strength over time, and hence the same SAR, but the time sequence of tips adds to zero in areas outside the selected slice and adds to the desired flip angle in areas within the slice.

FIGS. 1A-1C illustrates conventional slice-selective excitation. FIG. 1A shows an RF time envelope and gradient current waveform. The RF waveform was designed by Fourier transform and has the form of a sine function multiplied by a Hamming window function. The waveform is scaled for a 90° flip angle. FIG. 1B shows the resulting transverse magnetization in its components Mx and My achieved by this excitation if performed with an RF coil having uniform amplitude and constant phase sensitivity profile. Units are in fraction of the equilibrium longitudinal magnetization $M_{zo}$. The non-zero value of Mx within the slice profile is a consequence of violation of the low-flip angle assumption upon which RF design by Fourier transform is based, and is generic to any RF pulse designed by the Fourier transform method. FIG. 1C shows the SAR due to the component of B1 in the transverse x-y plane. SAR due to B1 in the z axis is not considered. Units of SAR in FIG. 1C are arbitrary.

Slice-Selective Excitation with Multiple Coils

When multiple RF coils are used, a pattern of destructive and constructive interference of the RF fields from each coil can result in decreased SAR in some regions of the imaging volume. With appropriately designed RF coils, RF coil current waveforms, and gradient waveforms, slice selective excitation can be achieved with greatly reduced SAR. As used herein, the term "coil element" is a broad term and can refer to an RF coil or a component of an RF coil that sends an RF signal via an RF channel. In some embodiments, an RF coil may comprise multiple RF coil elements.

SAR reduction is obtained by a factor of 3 for a system of three independent RF current sources and three different RF coils. The underlying principle may be extended to any number of coils and RF channels, with SAR reduction factor up to the number of coils and channels.

Figure 2:
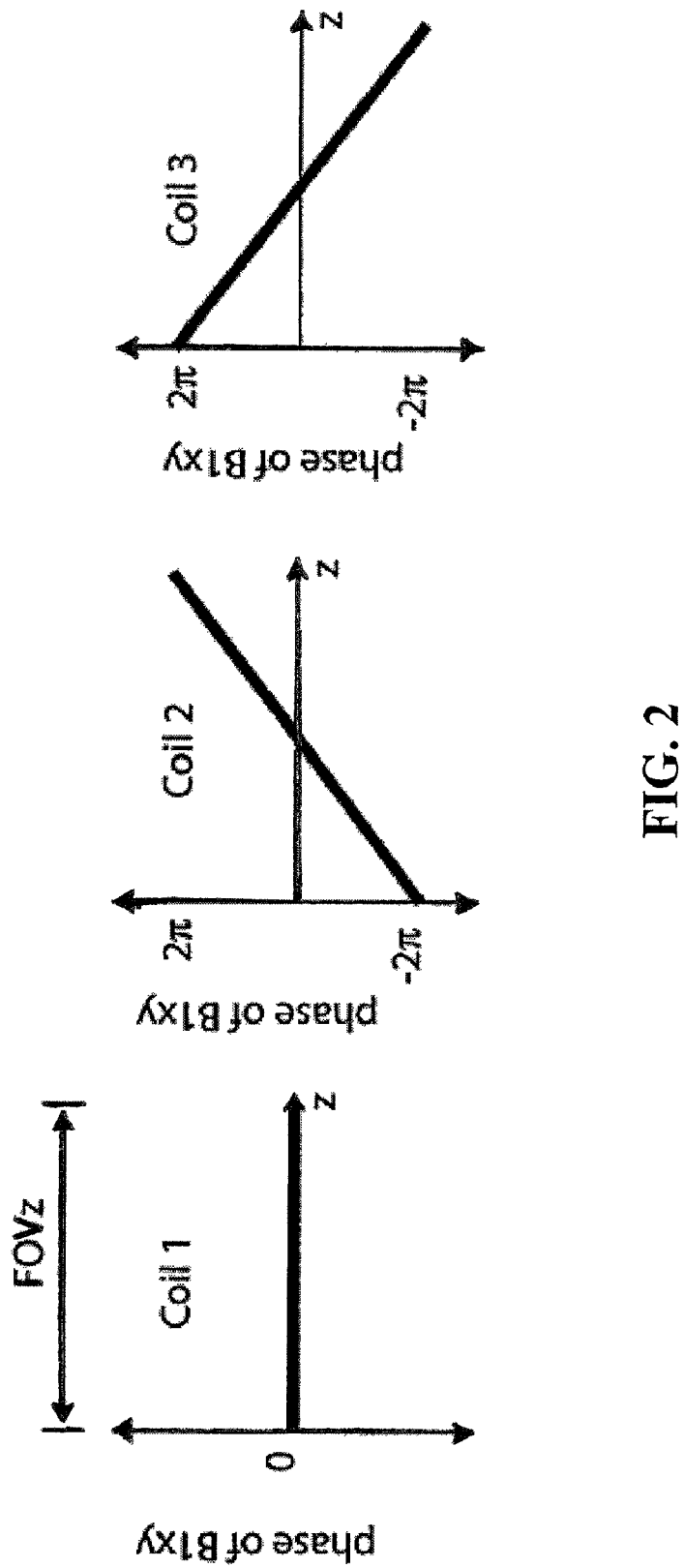
FIG. 2 depicts a coil sensitivity profile phase for a 3-coil embodiment.

FIG. 2 depicts a coil sensitivity profile phase for a 3-coil embodiment. Coil 1 has a constant sensitivity amplitude and a zero phase. Coil 2 has a constant amplitude but a phase which varies linearly in z. Coil 3 has a constant amplitude but a phase which varies inversely linearly in z. Coil amplitude and phase refer to amplitude and phase in the x-y plane, neglecting the RF field in the z direction (B1z), which does not contribute to excitation. B1z does contribute to SAR, and minimization of B1z can be a goal of coil design.

In some embodiments, a set of RF coils that can be designated as a "linear phase" coil configuration. In this configuration, one coil has a sensitivity profile with a uniform amplitude and a constant phase across the imaging volume. The second coil has a uniform amplitude but a phase that varies linearly in a single direction with a total of $2\pi$ phase variation across the imaging volume. The third coil has a uniform amplitude but a phase that varies linearly in the same direction with a total variation of $-2\pi$ radians. The phase of the coil sensitivity profile for these three coils is illustrated in FIG. 2. For concreteness, the direction of phase variation can be considered to be the z axis, the direction of the main field. Phase variation in any direction could be used with the proposed method of slice selection. The z axis can be selected, in some embodiments, for concrete illustration because coil designs exist which give the desired coil sensitivity with nearly uniform amplitude and with linear phase distribution along the z axis. One physical realization of such an RF coil set would be a set of three birdcage coils which are arranged coaxially along the z axis, with the second coil twisted to give $+2\pi$ radians phase variation across the z field of view, and the third coil twisted to give $-2\pi$ radians phase variation across the z field of view. A twisted birdcage coil having such a linear phase property has been described in Alsop D C, Connick T J, Mizsei G., A spiral volume coil for improved RF field homogeneity at high static magnetic field strength, Magn Reson Med 1998; 40(1):49-54, the entirety of which is incorporated herein and made a part of this specification. An alternative physical realization would consist of coaxial birdcage coils with an external shield separated from the birdcage rungs by a dielectric, as described in Foo T K, Hayes C E, Kang Y W, Reduction of RF penetration effects in high field imaging, Magn Reson Med 1992; 23(2):287-301, the entirety of which is incorporated herein and made a part of this specification.

In this context, the phase and amplitude referred to are of the component of the coil sensitivity profile which lies in the transverse x-y plane of the MRI system, i.e. the plane perpendicular to the main field. The z component of the RF coil sensitivity profile is neglected. The z component of the RF field does not contribute to excitation, but is a source of SAR. Coil design optimization can be performed to minimize the z component of the RF field. Reduction in SAR with the current method refers only to the component of SAR related to the RF field in the transverse x-y plane.

The RF waveforms for all three coils are calculated independently as if the coils were to be used singly to achieve a conventional slice selective excitation. One example of a suitable RF waveform design process would be the Fourier transform method. The RF waveform for the second coil (with $+2\pi$ linear phase) is designed by replicating the RF waveform of coil 1, but shifting it in time. The time shift length is chosen so that the amount of linear phase which accumulates during the interval due to the gradient field is equal to the linear phase of the RF coil. Specifically, if a given coil has linear phase of $2n\pi$ across the FOV, the time shift $\Delta t$ of the RF waveform for this coil relative to the RF waveform of the coil with constant phase (designated coil 1 in our concrete 3-coil scenario) is $$\Delta t = 2n\pi/\gamma G \quad (1.1)$$

where G is the gradient strength of the slice-select gradient (Gz in our implementation) and γ is the gyromagnetic ratio in units of radians per unit gradient strength.

Similarly, the RF waveform for the third coil is shifted by a corresponding time increment which, for this particular coil configuration, will be the negative of the time shift of the second coil's waveform. Finally, the amplitude of each RF waveform is multiplied by a factor of ⅓. The resulting RF current waveforms for each of the three channels are shown in FIG. 3A.

Figures 3A, 3B, 3C:
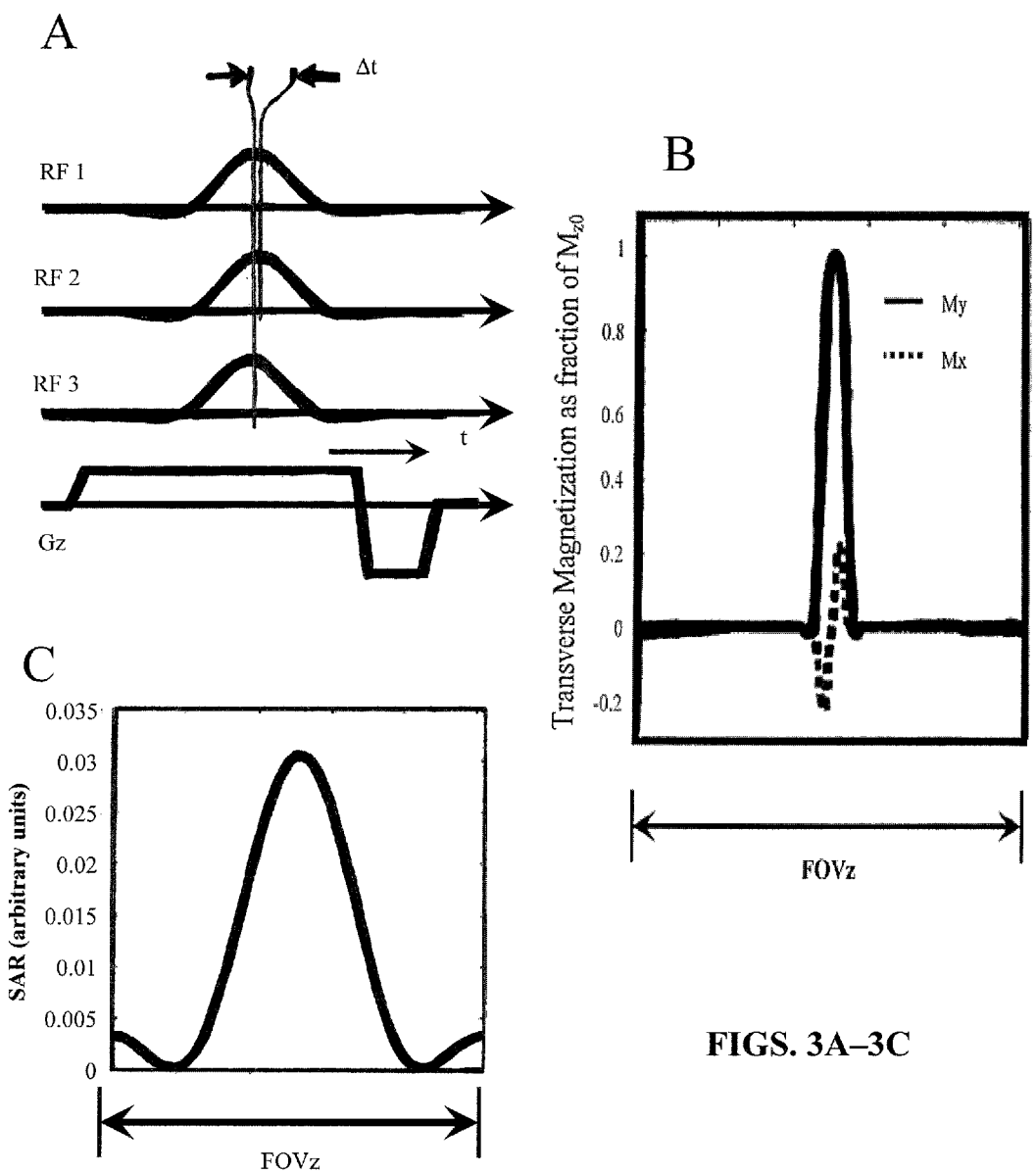
FIG. 3A depicts embodiments of slice selection with a 3-channel system, showing RF waveforms for each of the three channels.
FIG. 3B depicts embodiments of slice selection with a 3-channel system, showing transverse magnetization achieved by the 3-channel system.
FIG. 3C depicts embodiments of slice selection with a 3-channel system, showing SAR from transverse component of B1 for the 3-channel system.

FIGS. 3A-3C depict a slice selection with a 3-channel system. FIG. 3A depicts RF waveforms for each of the three channels. Each waveform is scaled by ⅓ compared to the single channel waveform of FIG. 1A. The waveform for channel 2 lags the waveform for channel 1 by $\Delta t$. The waveform for channel 3 leads the waveform for channel 1 by $\Delta t$. The gradient waveform is unchanged from the single channel case of FIG. 1A. FIG. 3B depicts transverse magnetization achieved by the 3-channel system. This is essentially identical to that achieved by the single channel system shown in FIG. 1B. FIG. 3C depicts SAR from transverse component of B1 for the 3-channel system. Unlike the single channel system, SAR for the three channel system is a function of location in the z direction. Units are arbitrary, but are the same as in FIG. 1C for comparison. Total SAR over the field of view is ⅓ that of the SAR for the single channel system.

The achieved transverse magnetization Mxy resulting from the 3-channel excitation scheme is shown in FIG. 3B. The excited slice profile is nearly identical to that achieved by a conventional single channel excitation shown in FIG. 1B. FIG. 3C shows the SAR due to the component of B1 in the x-y plane. Unlike SAR with a conventional one-channel slice selective excitation, SAR in the 3-channel system has a spatial variation. Units in FIG. 3C are arbitrary, but are the same as in FIG. 1C for accurate comparison. SAR for the 3-channel system is equal to or lower than SAR for the two-channel system at every point in the imaging field of view (FOV). SAR averaged over the entire FOV is decreased in the 3-channel excitation by a factor of 3.

Figure 4A:
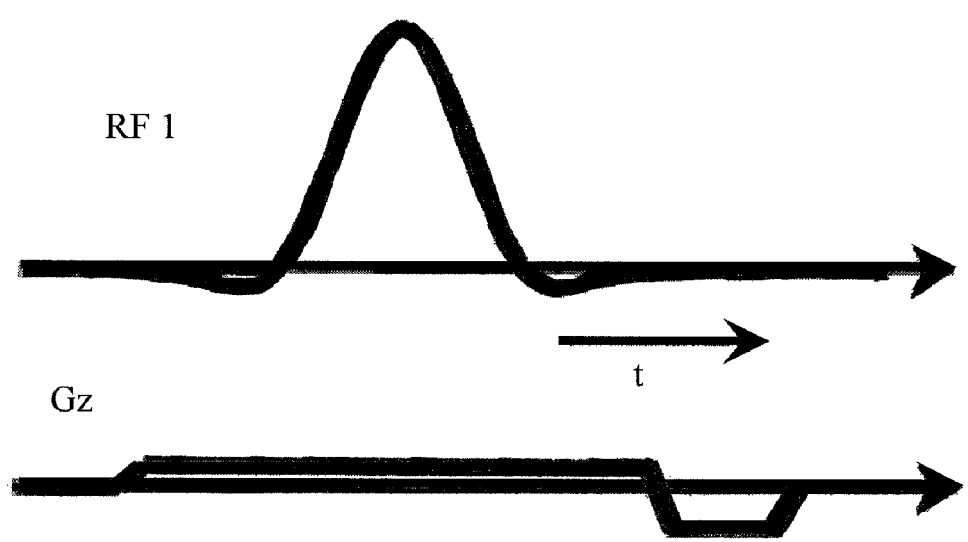
FIG. 4A depicts RF and gradient waveforms for a slice selective excitation for a thick slice with width one-half the field of view.
Figure 4B:
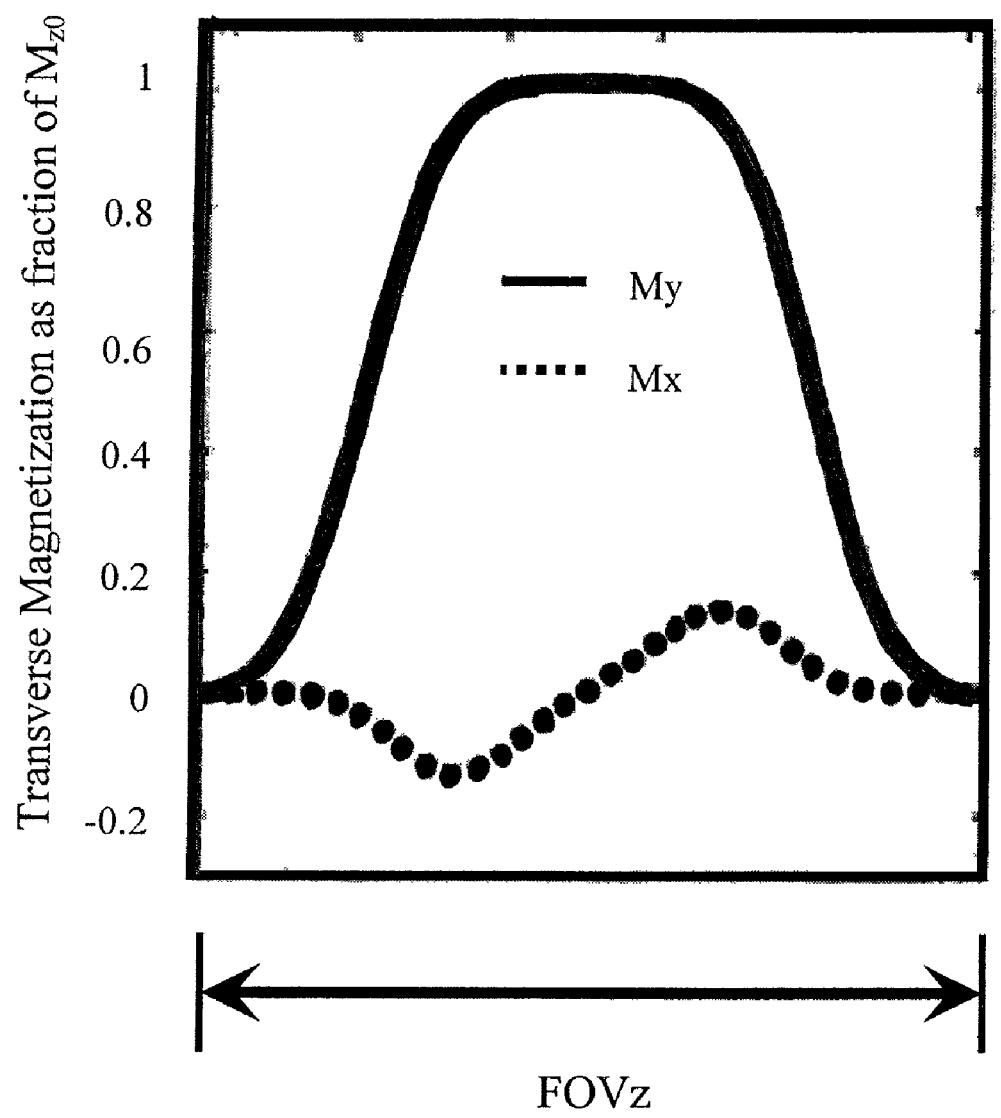
FIG. 4B depicts achieved transverse magnetization for a slice selective excitation for a thick slice with width one-half the field of view.
Figure 4C:
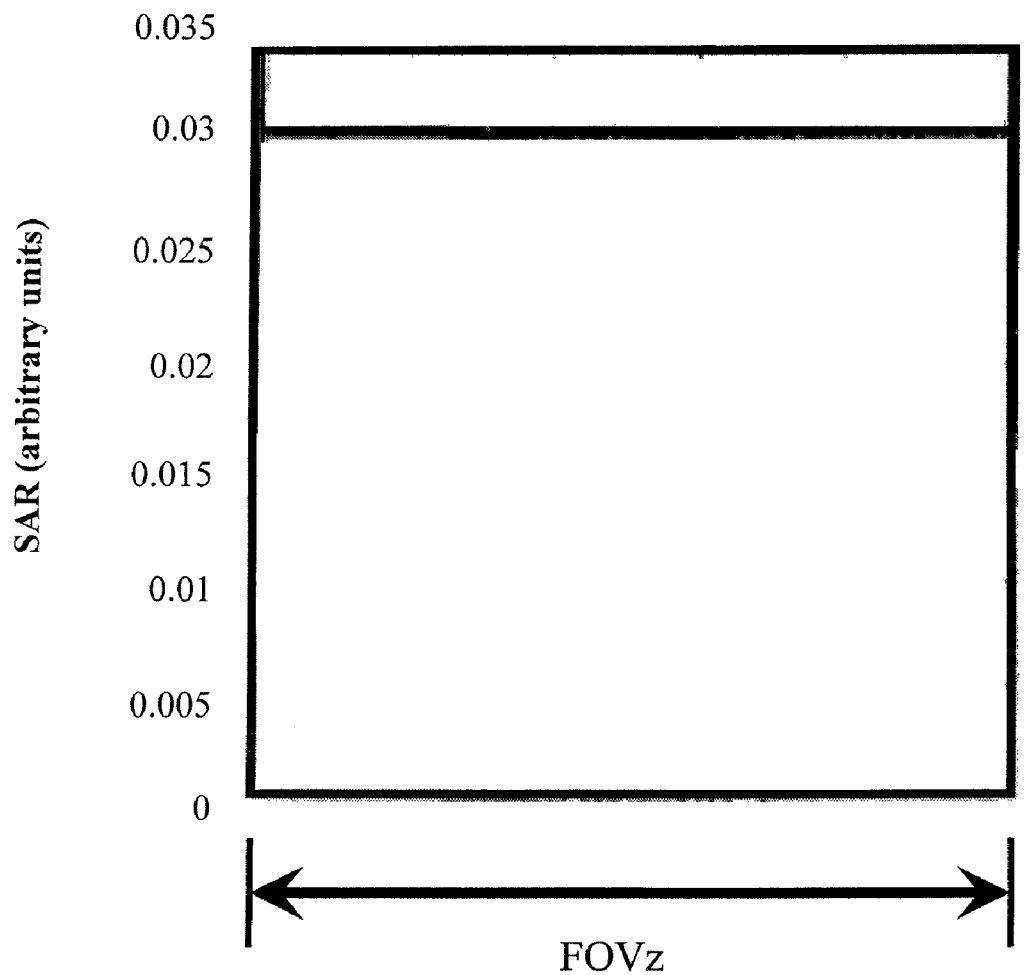
FIG. 4C depicts relative SAR for a slice selective excitation for a thick slice with width one-half the field of view.

FIGS. 4A-4C depict a conventional slice selective excitation for a thick slice with width one-half the field of view, with FIG. 4A depicting RF and gradient waveforms, FIG. 4B depicting achieved transverse magnetization, and FIG. 4C depicting relative SAR.

Figure 5A:
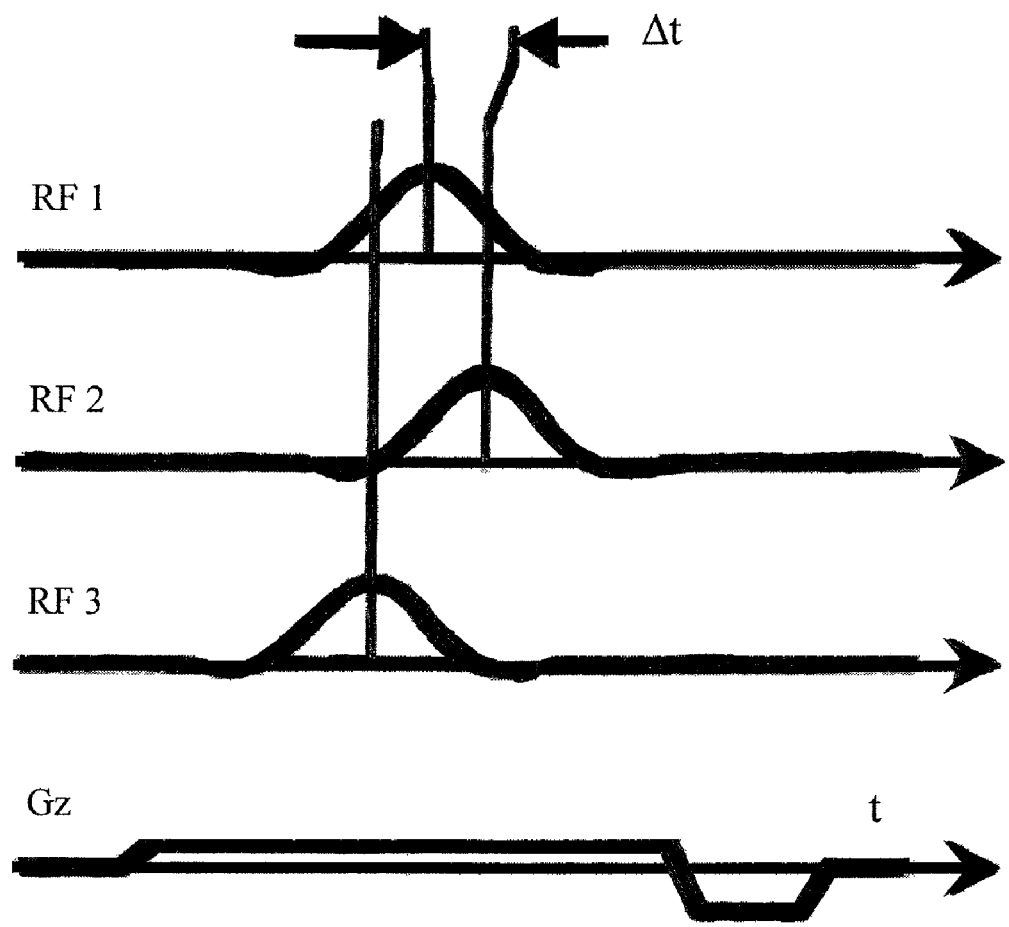
FIG. 5A depicts RF and gradient waveforms of a reduced SAR slice selection for a thick slice with a width one-half the field of view, and with a 3-channel system.
Figure 5B:
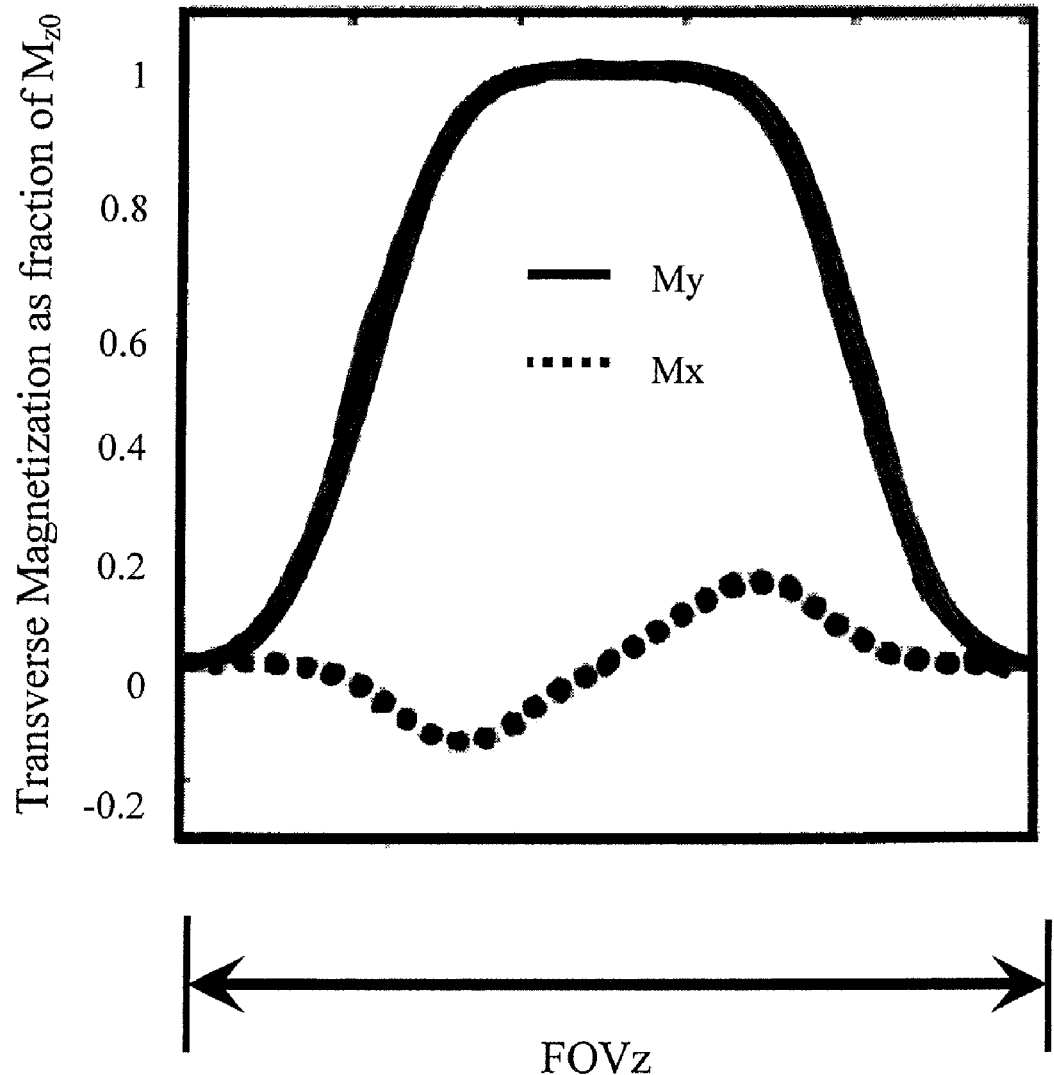
FIG. 5B depicts achieved transverse magnetization of a reduced SAR slice selection for a thick slice with a width one-half the field of view, and with a 3-channel system.
Figure 5C:
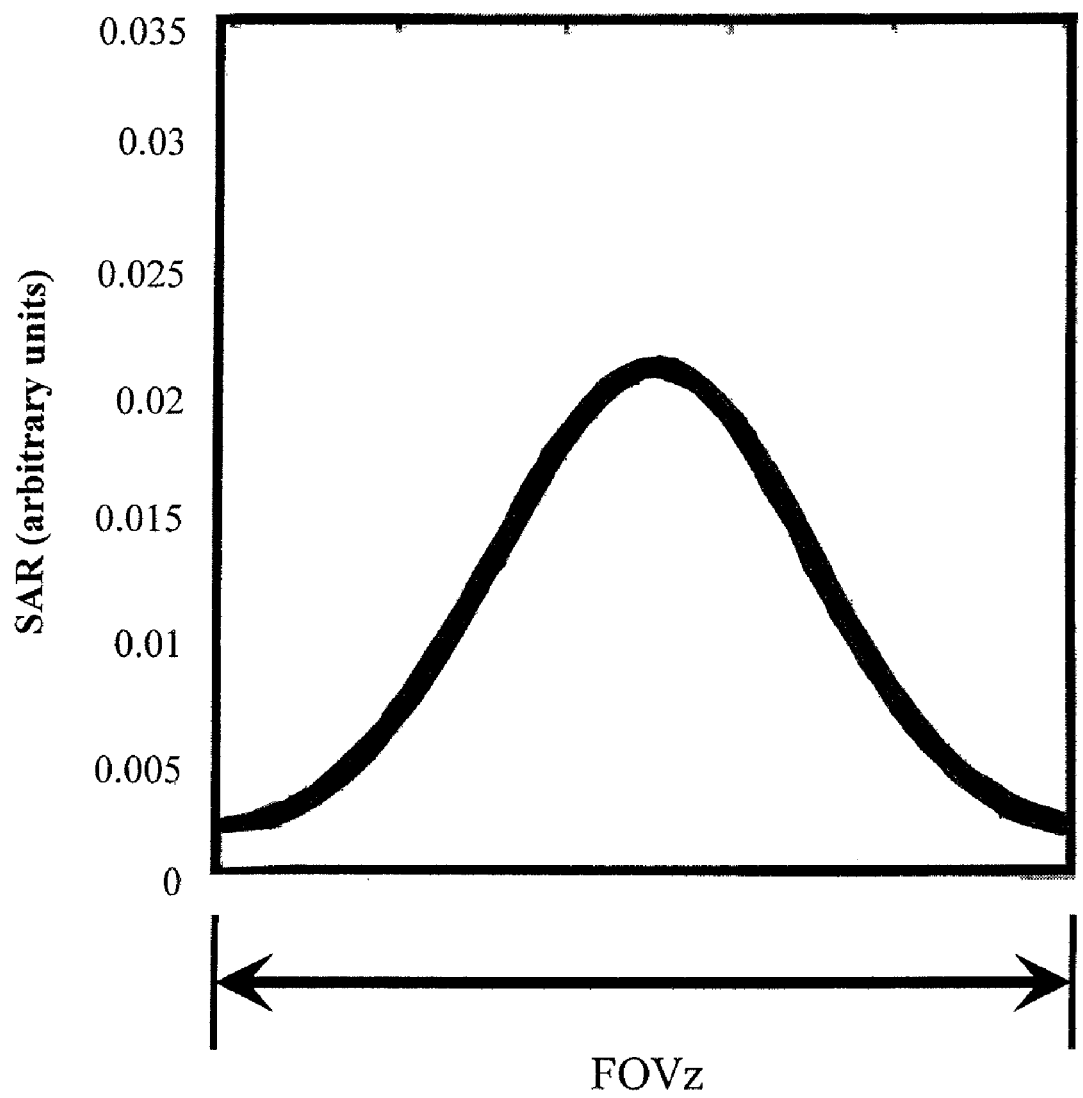
FIG. 5C depicts relative SAR arising from the transverse component of B1 of a reduced SAR slice selection for a thick slice with a width one-half the field of view, and with a 3-channel system.

FIGS. 5A-5C depict a reduced SAR slice selection for a thick slice with a width one-half the field of view, with a 3-channel system. FIG. 5A depicts RF and gradient waveforms. The time offset $\Delta t$ is calculated according to Equation (1.1) and is greater than for the thin slice selection of FIG. 3. FIG. 5B depicts achieved transverse magnetization, which is essentially the same as for the single channel system of FIGS. 4A-4C. FIG. 5C depicts relative SAR arising from the transverse component of B1. Units are arbitrary, but are the same as for FIGS. 4A-4C to allow comparison. SAR integrated over the FOV is ⅓ that of the single transmitter system.

RF waveforms and excitation results for conventional single-channel excitation and the 3-coil system are presented in FIGS. 4A-4C and 5A-5C for a slice thickness equal to one half the imaging field of view. Such excitation might be used for slab selective excitation for 3-dimensional imaging. Although the shape of the SAR distribution across the imaging FOV varies with slice thickness, the factor of transverse SAR reduction is independent of slice thickness. For a given RF waveform, slice thickness is increased by decreasing gradient amplitude. This results in a longer delay time $\Delta t$, according to Equation (1.1), which is illustrated in FIG. 5A.

This method can be extended to any number of RF channels, each controlling current through a coil with linear phase distribution with a different multiple of $2\pi$ phase variation across the imaging field of view. Slice profiles nearly identical to the single-channel case are obtained with transverse SAR reduction factor equal to the number of channels.

Figure 6:
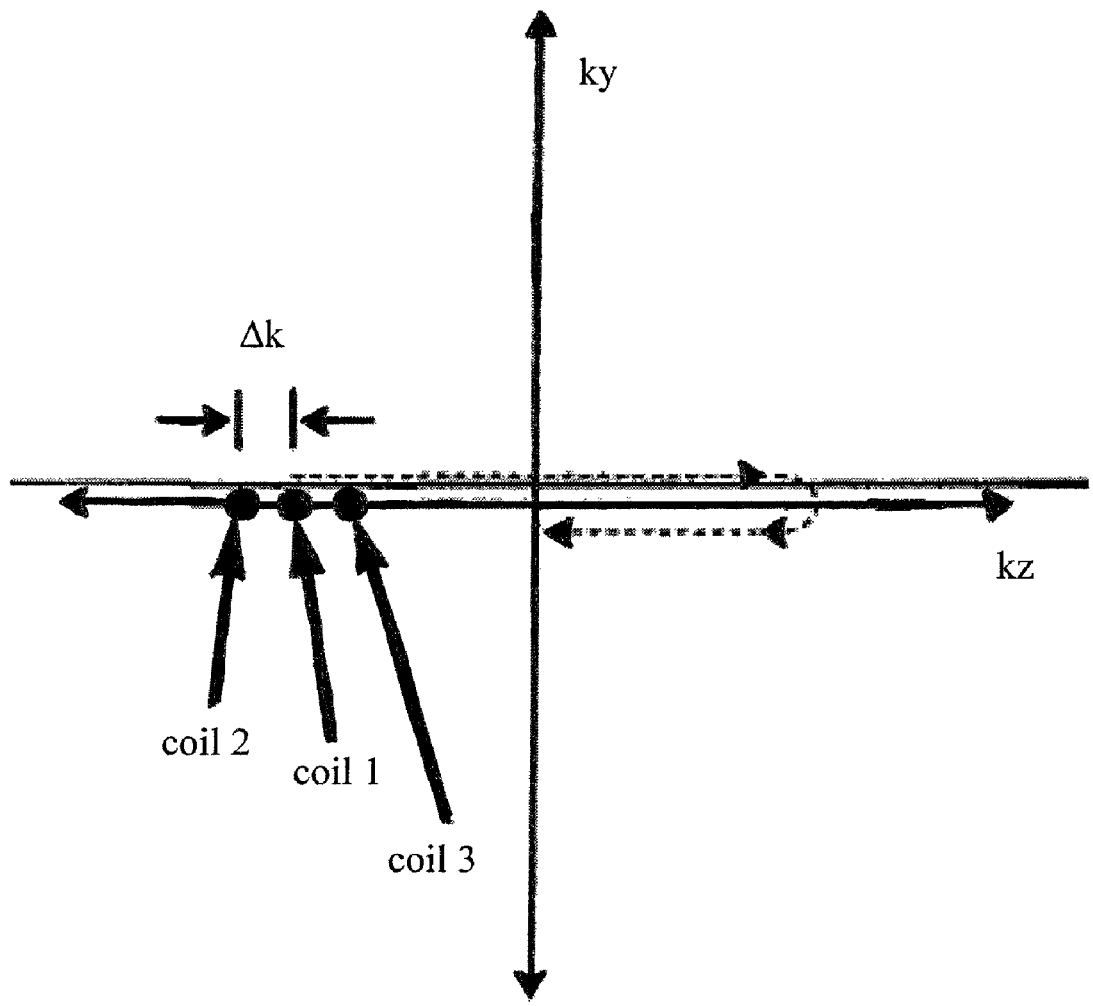
FIG. 6 depicts a k-space representation of 3-channel excitation.

FIG. 6 depicts a k-space representation of 3-channel excitation. Each coil represents a point in excitation k-space. The distance $\Delta k$ between points represents the linear phase in the sensitivity profile of each coil, in units of excitation k-space (i.e. cycles/cm). The dotted line shows the trajectory through excitation k-space traversed by the z gradient. The initial left-to-right path corresponds to the positive gradient lobe. The subsequent right-to-left path corresponds to the negative gradient refocusing lobe. The excitation from all three coils traverse the same k-space trajectory in tandem.

Insight into this excitation scheme may be gained by considering the excitation in k-space. As illustrated in FIG. 6, the three coils correspond to three points in excitation k-space. When the gradient is turned on and excitation begins, the excitation k-space is traversed. If each coil is to produce an identical slice profile, the same excitation k-space must be scanned by each coil. This is achieved by making the RF waveforms the same but shifted in time relative to each other. The time shift for each coil's RF waveform (relative to the constant phase coil, coil number 1) depends on the speed of k-space traversal (i.e., gradient strength) and on the separation of the three points in excitation k-space (i.e., the amount of linear phase incorporated into each RF coil).

Figure 7A:
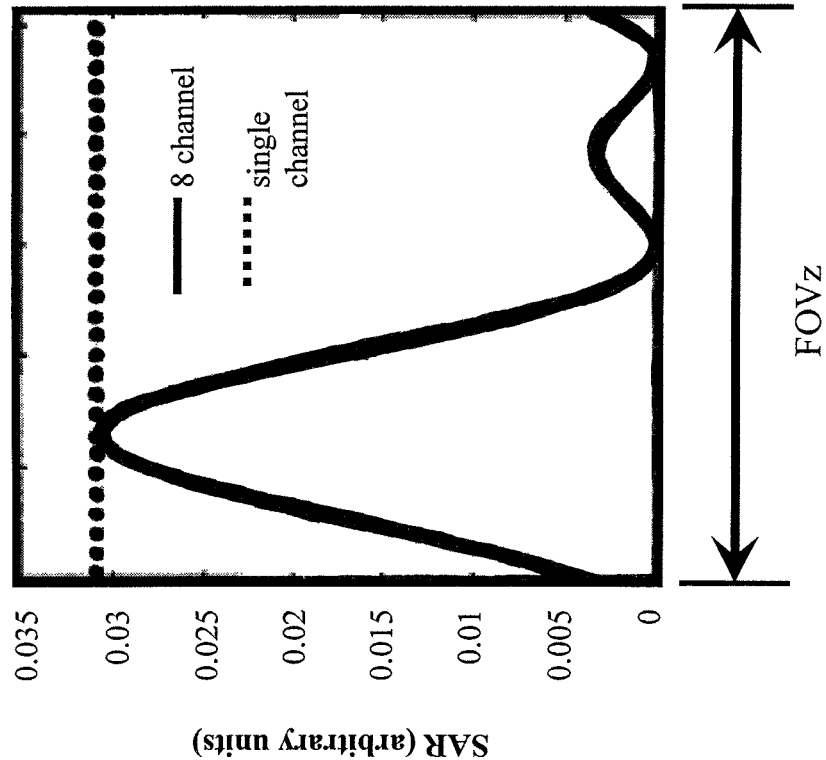
FIG. 7A depicts a 3-channel excitation of an off-isocenter axial slice, showing transverse magnetization achieved by 3-channel excitation of off-isocenter slice modulate ¼ field of view to the left.
Figure 7B:
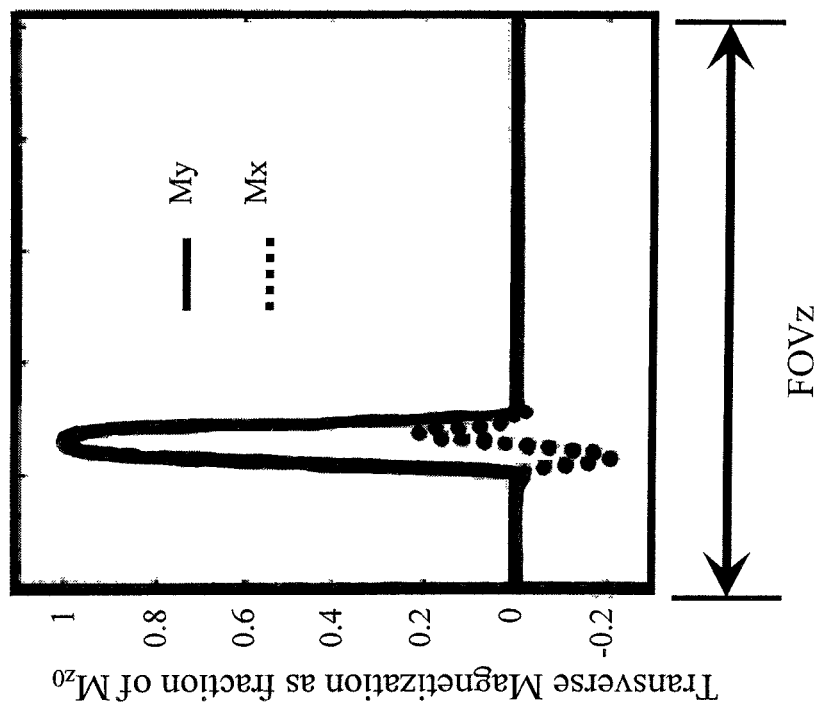
FIG. 7B depicts relative SAR due to transverse B1.

FIGS. 7A-7B depict a 3-channel excitation of an off-isocenter axial slice. Movement of the slice profile off-isocenter is achieved by modulating the RF waveforms by the appropriate frequency, as in conventional slice selective excitation. For this example, this was accomplished by adding the appropriate phase to each point of the RF time envelope. FIG. 7A depicts transverse magnetization achieved by 3-channel excitation of off-isocenter slice modulated ¼ FOV to the left. FIG. 7B depicts relative SAR due to transverse B1. The SAR profile shifts with the slice. Total SAR across the imaging FOV is reduced by ⅓, which is the same as for the unshifted case.

The slice selective transmit SENSE excitation can be modulated to an off-isocenter slice location by modulation frequency offset of the RF waveforms in the same manner used for off-isocenter selection of a conventional slice selective excitation. Modulation off-isocenter causes no change in the performance of the method and no change in SAR reduction. The spatial SAR profile shifts along with the slice profile when the center frequency of the RF waveform is changed. This is illustrated in FIGS. 7A-7B.

Figure 8A:
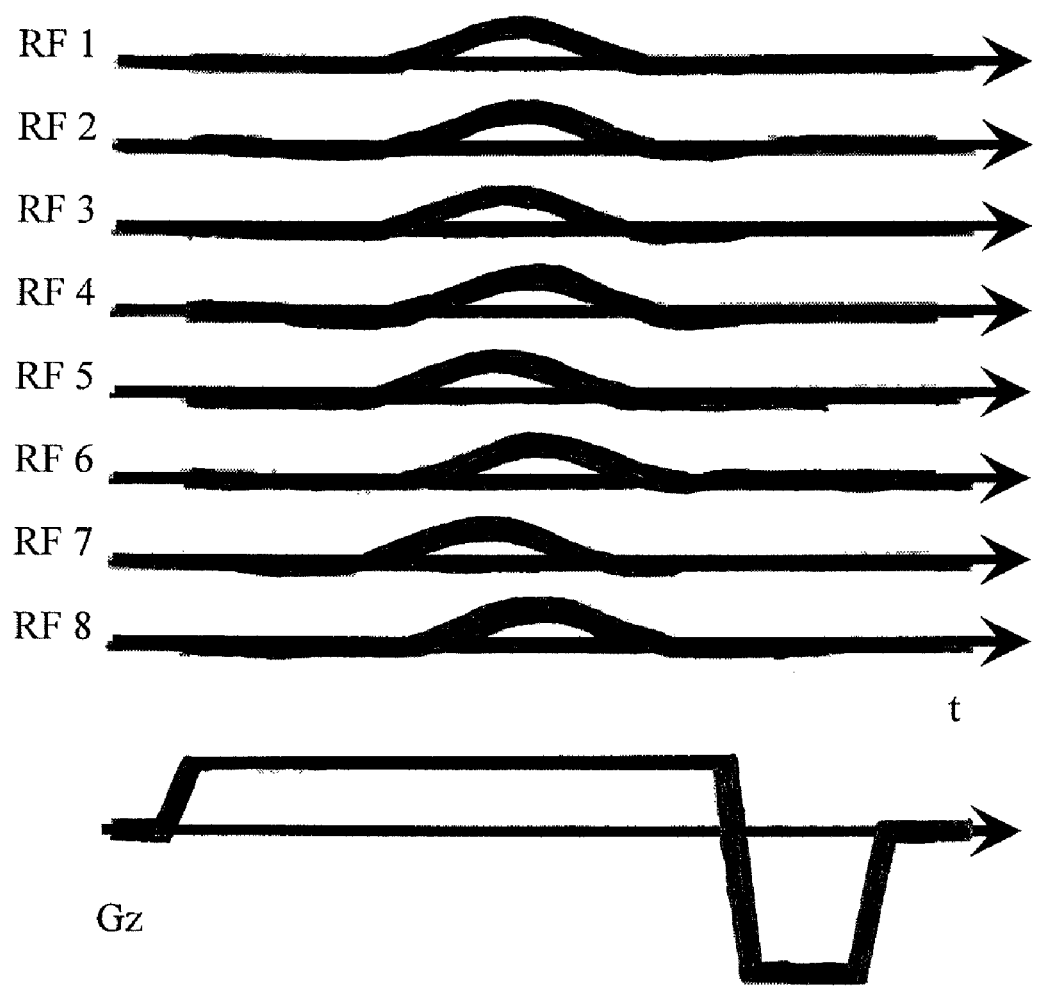
FIG. 8A, depicts RF waveforms 1 through 8 designed for coil sets for embodiments of slice selective excitation with 8 RF channels.
Figure 8B:
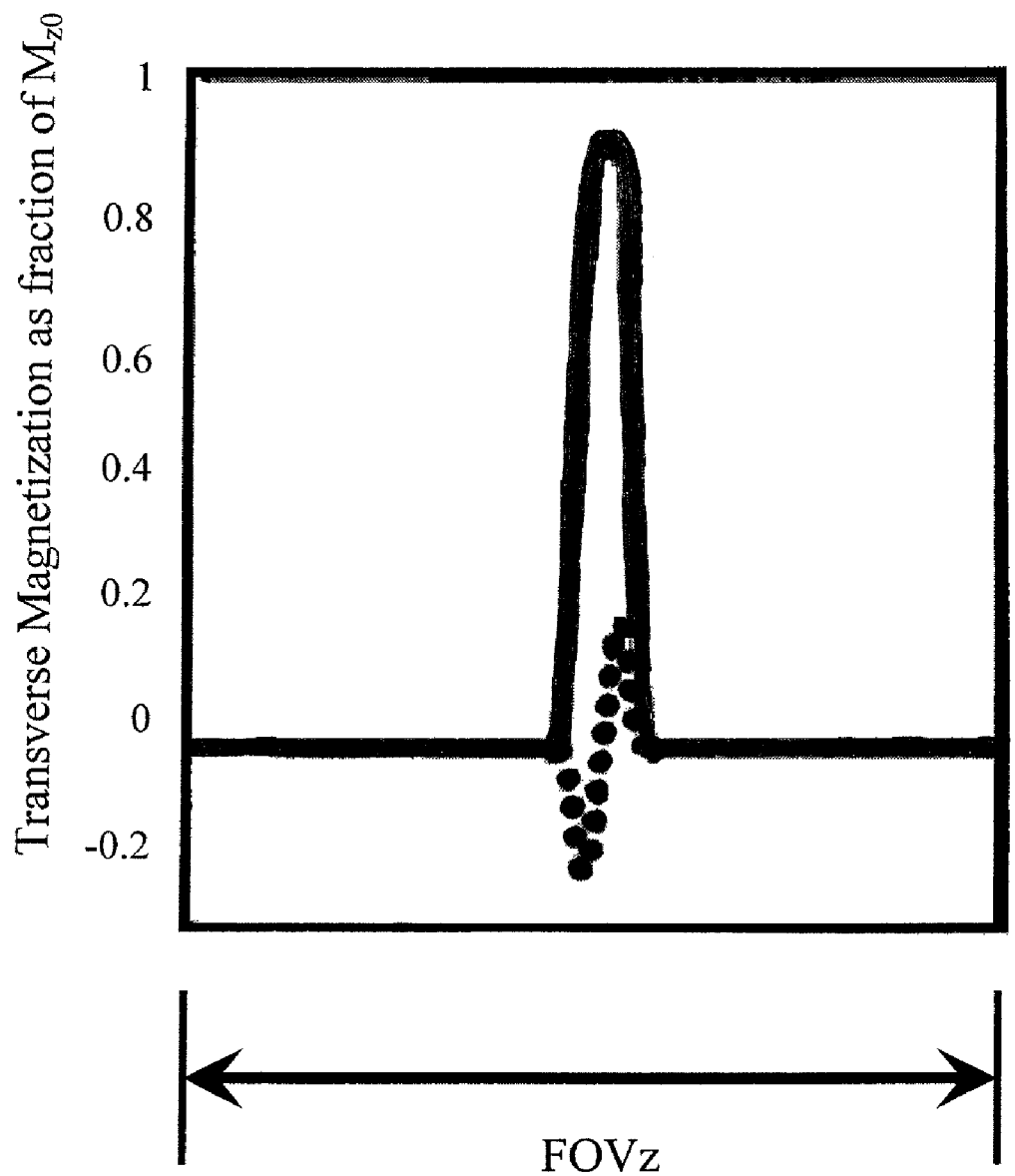
FIG. 8B depicts the transverse magnetization for embodiments of slice selective excitation with 8 RF channels.
Figure 8C:
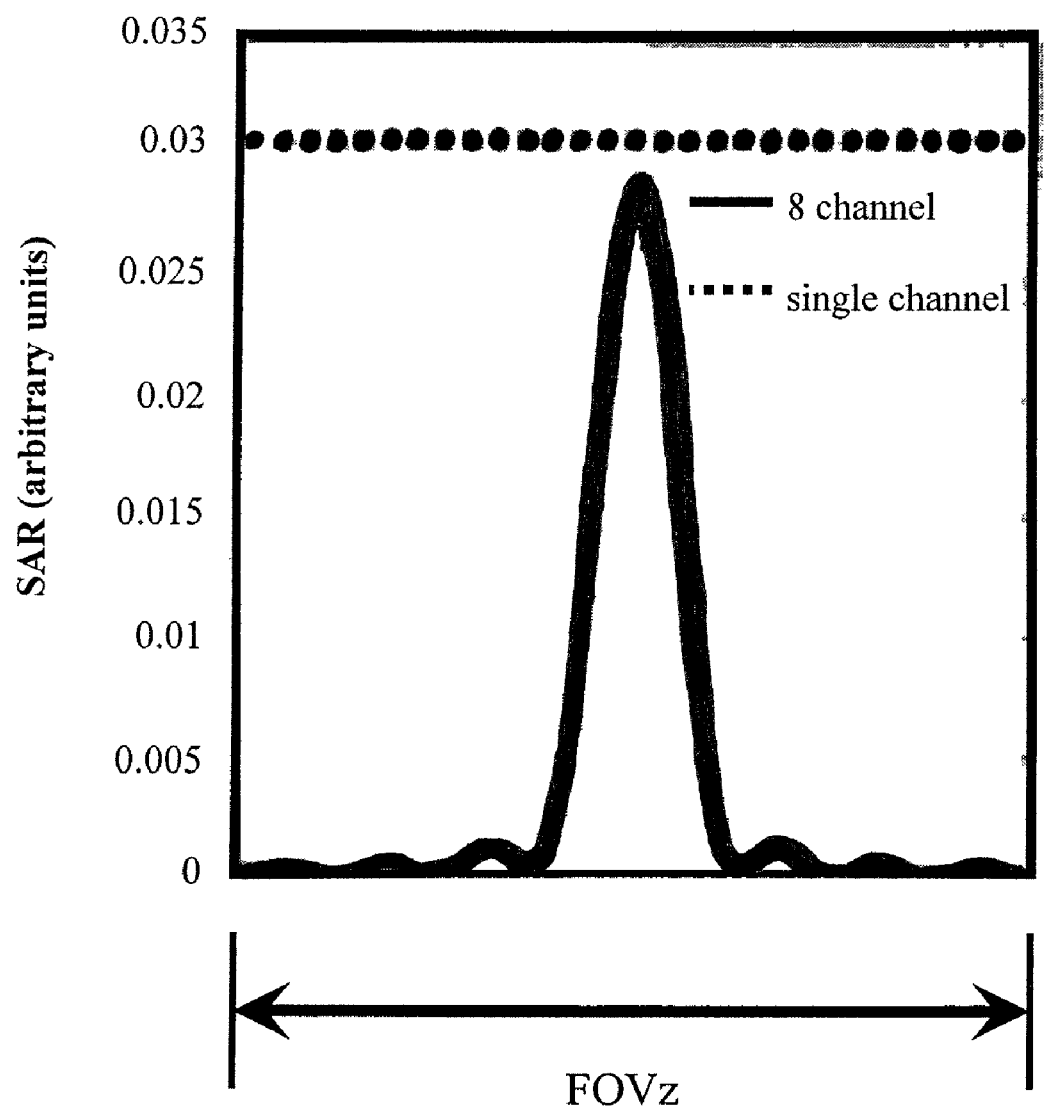
FIG. 8C depicts SAR for the 8-channel system integrated over the field of view.

FIGS. 8A-8C depict slice selective excitation with 8 RF channels. FIG. 8A depicts RF waveforms 1 through 8 designed for coil sets having $0, 2\pi, -2\pi, 4\pi, -4\pi, 6\pi, -6\pi$, and $8\pi$ linear phase respectively. FIG. 8B depicts that the slice profile achieved is essentially identical to that achieved by single channel system. FIG. 8C depicts that the SAR for the 8-channel system integrated over the field of view is ⅛ that of the single channel system.

The method can be extended to any number of channels, with decrease in SAR by a factor of the number of channels. FIGS. 8A-8C shows results for an eight-channel system, with coils varying from $-6\pi$ phase through $8\pi$ linear phase over the imaging volume, for a slice thickness 1/16th the field of view. In general, the degree of SAR decrease integrated over the coil volume is proportional to the number of channels and is unaffected by the slice thickness of the excitation. The shape of the SAR distribution changes with slice thickness, as illustrated in FIGS. 3A-3C and 4A-4C, and with the number of channels, as illustrated by FIGS. 3A-3C and 8A-8C.

Performance for Off-Axial Slices

The above description is based on slice selection in a plane perpendicular to the direction of phase variation of the RF coil elements. For a twisted birdcage coil oriented along z, this corresponds to excitation of an axial slice, i.e. in the x-y plane. If the desired excitation is in a plane outside the true axial plane, the performance of the method changes. The degree of SAR decrease remains unchanged, but the slice flip angle profile becomes modulated by a sinusoidal function in one in-slice direction. For a two coil system, this modulation has a cosine form. For more coils, the modulation becomes a more complex summation of sinusoids.

Figure 9:
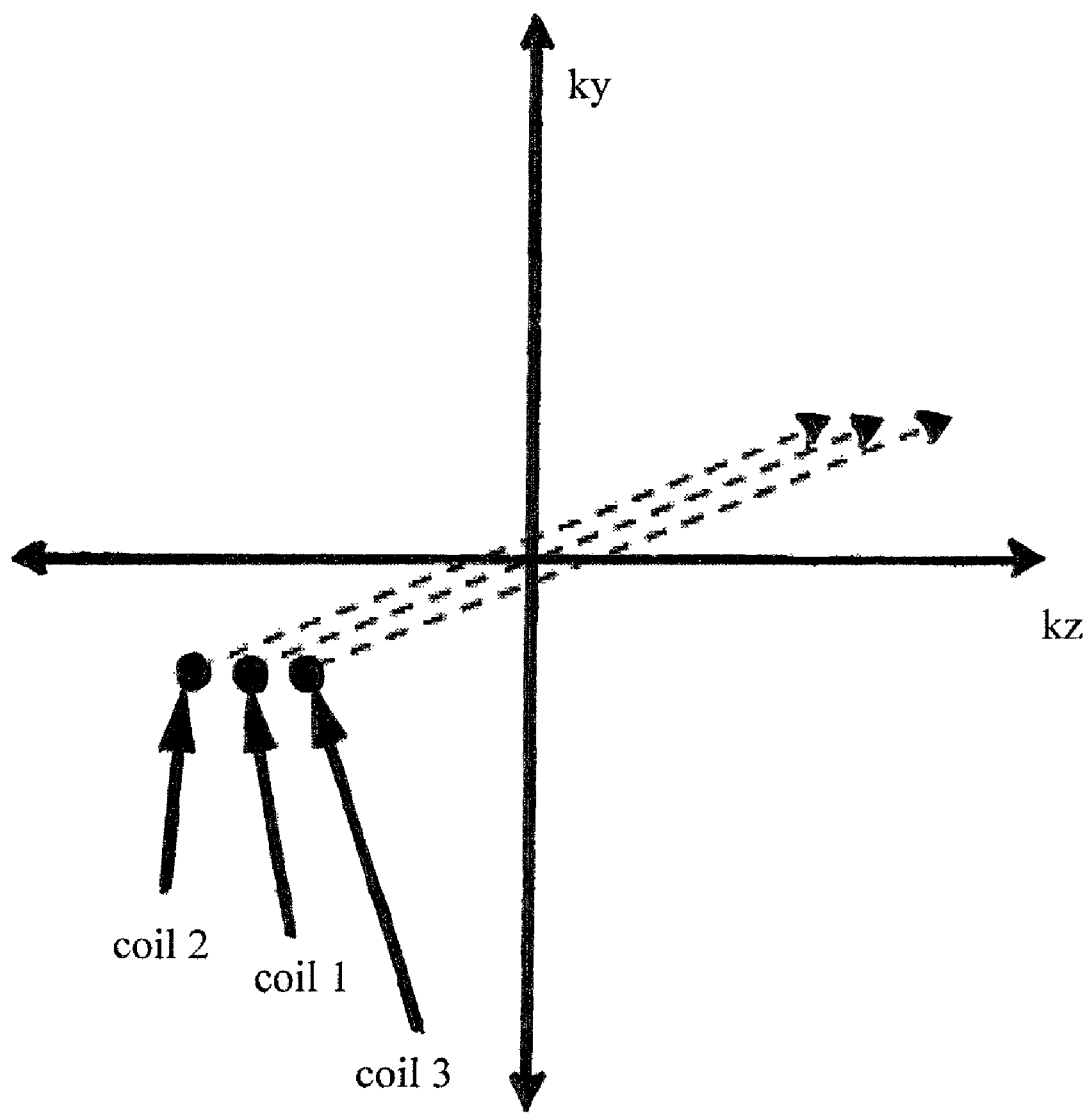
FIG. 9 depicts a 3-coil excitation of an off-axial slice visualized in excitation k-space.

FIG. 9 depicts a 3-coil excitation of an off-axial slice visualized in excitation k-space. As in the axial slice case, the three coils represent three points in excitation k-space. Unlike the axial slice case, the excitation k-space trajectories traversed by each coil for off-axial slice excitation are not collinear.

Insight into the performance of the method for off-axial slices can be gained by considering the coil configuration in excitation k-space. This is illustrated for a 3-coil configuration in FIG. 9. For example, illustrated is the case of 30° rotation of the slice toward the plane of constant y. This is achieved by playing the gradient waveform out over both the z and y gradient coils simultaneously, appropriately weighted to give the correct rotated gradient direction and amplitude. Although illustrated for a single off-axial plane, the following analysis of the performance of the multiple coil slice selection method applies to any off-axial plane.

The three coils correspond to three points in excitation k-space, the same as in the axial slice case. In the axial slice case, the k-space trajectory was only along the z axis, and all three coils deposited excitation k-space energy along the z axis only, resulting in a one dimensional excitation k-space and a resulting excitation which was selective only in z, and constant in x and y. For the off-axial slice case, the excitation becomes two dimensional, as the k-space trajectories of the individual coils are no longer along the same line. The resulting excitation will be selective in two dimensions (z and y in the particular case illustrated in FIG. 9).

RF waveforms are designed for the off-axial slice case in the same way as for the axial slice, but with a different time offset $\Delta t$ between the waveforms given now by $$\Delta t = 2n\pi \cos\theta/\gamma G \qquad (1.2)$$

where $\theta$ is the angle between the selected slice and the axial plane. Equation (1.2) for the off-axial plane differs from Equation (1.1) for the axial plane by the factor $\cos\theta$.

Figure 10:
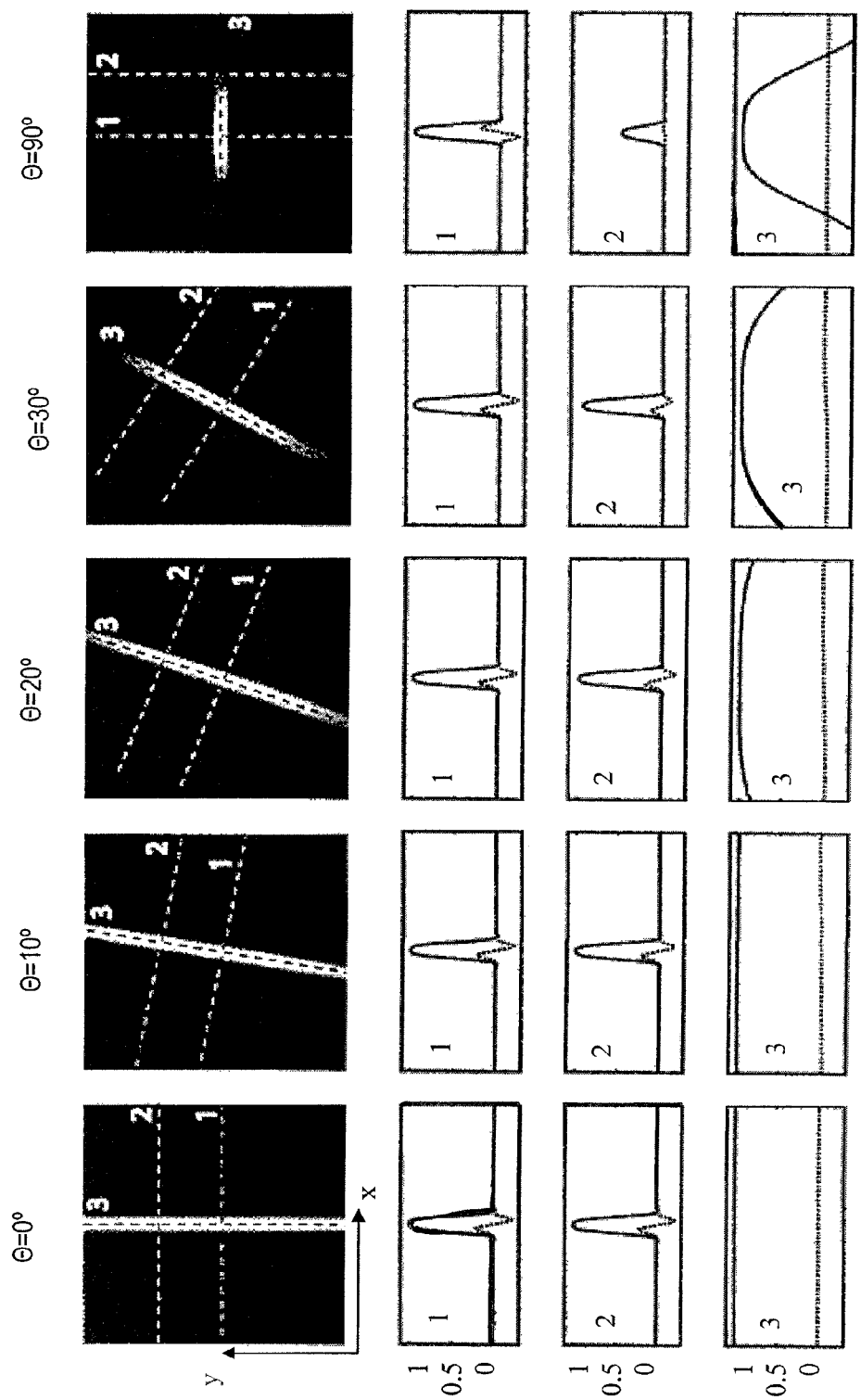
FIG. 10 depicts the performance of multiple coil excitation for off-axial slices.

FIG. 10 depicts the performance of multiple coil excitation for off-axial slices. Results are shown for a three-coil system, with RF waveforms equally weighted. The top row of FIG. 10 shows a magnitude of transverse magnetization as a function of location in z and y for various values of $\theta$, the angle of the slice plane with respect to the x-y plane. Slice profile is graphed along three lines labeled 1, 2, and 3 representing the slice profile at isocenter (1), the slice profile ¼ FOV away from isocenter (2), and along the in-slice direction (3). Slice profile at isocenter remains unchanged at any off-axial angle $\theta$. Slice profile away from isocenter decreases, in magnitude but retains the same shape as at isocenter. Note that variation in slice profile magnitude occurs in one in-slice direction (y in this case). There is no variation in the other in-slice dimension (x in this case). Slice profile remains nearly unchanged for off-axial angles up to 30°. SAR reduction by ⅓ remains the same for any off-axial angle $\theta$.

Simulation results are shown in FIG. 10 for the magnitude of the transverse magnetization achieved by the 3-coil system for various values of $\theta$, i.e. slice planes with various angles from the axial plane. For all of these values of $\theta$, the transverse SAR reduction factor of 3 is unchanged. However, for larger values of $\theta$ the modulation of the magnitude of the slice profile in one in-plane direction increases. The slice profile in the orthogonal in-slice direction remains constant. For the results shown in FIG. 10, the RF waveforms are all of the same magnitude.

In the example shown in FIG. 10, equal weighting of the three RF waveforms gives a modulation of the slice profile as a function of distance r from isocenter along one in-slice direction by a function $$m(r) = 1 + 2\cos(2\pi r \Delta k \sin\theta) \qquad (1.3)$$

where $\Delta k$ is the distance between k-space points representing each coil, as defined in FIG. 6.

Modulation of the slice profile magnitude occurs in one in-slice direction, and the slice profile remains constant in the orthogonal in-slice dimension. m(r) represents the Fourier transform of the excitation k-space along a line orthogonal to the k-space path defined by the constant slice select gradient. In particular, m(r) given in Equation (1.3) represents the Fourier transform of the function $$\delta(k) + \delta(k - \Delta k \sin\theta) + (k + \Delta k \sin\theta) \qquad (1.4)$$

which reflects the equal weighting of the three RF waveforms. We denote this weighting scheme as "1-1-1." Different weighting of the RF waveforms will give different shape to m(r), which may be optimized for particular imaging situations.

Figures 11A, 11B:
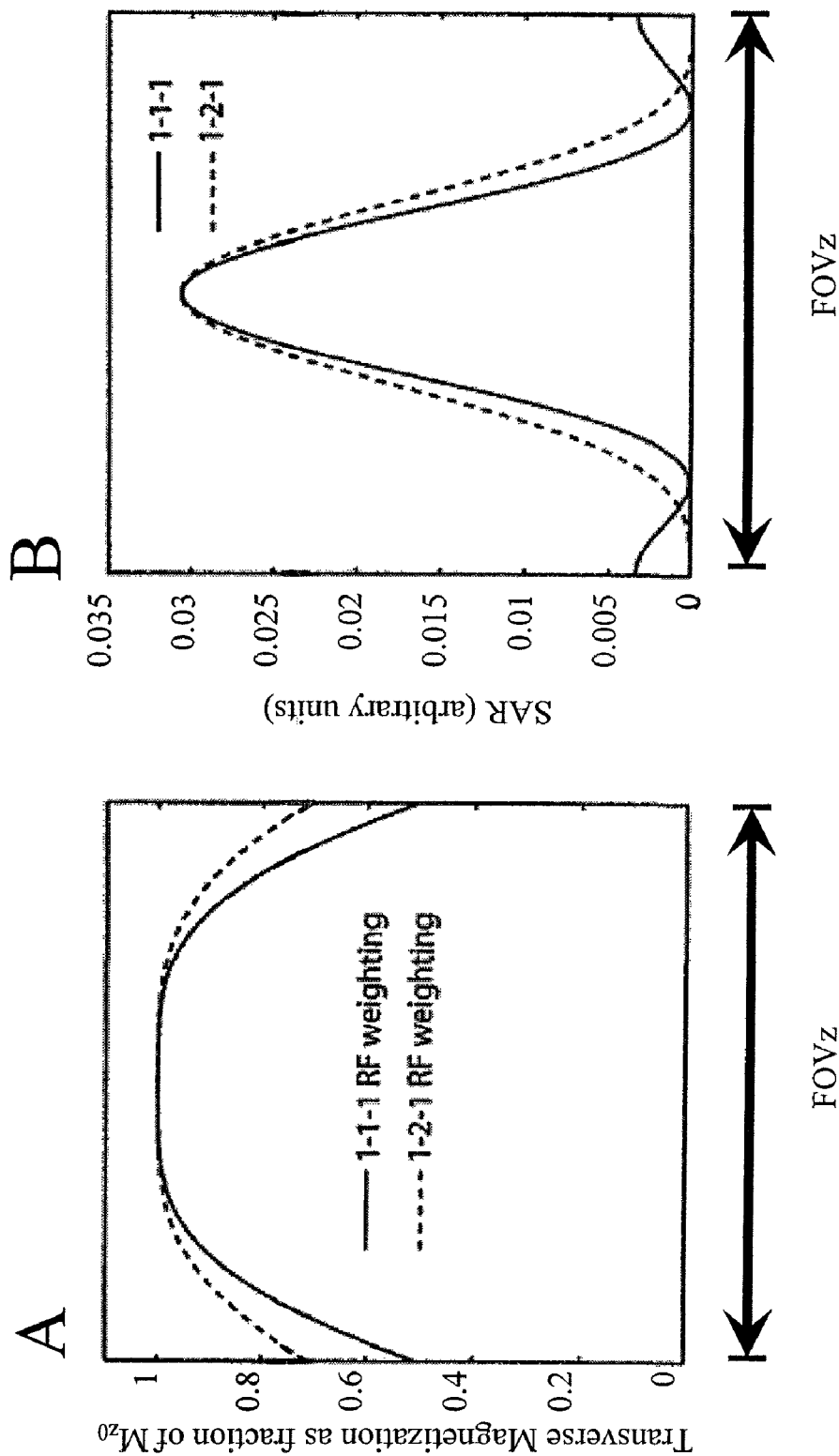
FIG. 11A depicts the magnitude of excitation profile in the in-slice direction.
FIG. 11B depicts the transverse SAR in connection with embodiments depicted in FIG. 11A.

FIGS. 11A-11B depict the effect of nonuniform weighting of the RF waveforms for a 3-channel system for a 30° off-axial slice. FIG. 11A depicts the magnitude of excitation profile in the in-slice direction (equivalent to line 3 in FIG. 10) showing modulation of the excitation amplitude. More uniform excitation is achieved with the 1-2-1 RF waveform weighting scheme (coil 1 waveform has twice the amplitude of coils 2 and 3) than with the 1-1-1 scheme (all RF waveforms are equal in amplitude). FIG. 11B depicts transverse SAR. Total SAR for the 1-2-1 scheme is 0.375 times the SAR of a single channel excitation, while total SAR for the 1-1-1 scheme is 0.333 times the single channel SAR. SAR reduction can be traded off for improved homogeneity of slice profile for off axial slices by adjusting the weighting of the RF waveforms, in this 3-channel example or with any number of channels. Maximum SAR reduction occurs when RF waveforms are equally weighted.

FIGS. 11A-11B show the results of excitation with the RF waveform of coil 1 weighted with twice the magnitude of the RF waveforms of coils 2 and 3, with waveforms renormalized to still give 90° flip angle. The corresponding k-space sampling function becomes $$\delta(k) + \frac{1}{2}\delta(k - \Delta k \sin\theta) + \frac{1}{2}\delta(k + \Delta k \sin\theta) \qquad (1.5)$$

which leads to a modulation function $$m(r) = 1 + \cos(2\pi r \Delta k \sin\theta) \qquad (1.6)$$

This scheme is denoted "1-2-1" in FIGS. 11A-11B.

FIGS. 11A-11B show that the uniformity of slice profile magnitude is improved with the 1-2-1 weighting, at the expense of slightly less SAR reduction. SAR for the 1-1-1 weighting is ⅓ that of single channel excitation, while SAR for the 1-2-1 scheme is 0.375 that of the single channel excitation. This example shows that SAR reduction can be flexibly traded off with slice profile uniformity for off-axial slices by adjusting the relative weighting of the different coil RF waveforms. With a large number of channels, the waveform design problem becomes a true two-dimensional Fourier transform design problem, for which an arbitrary in-plane slice profile can be prescribed. However, maximum SAR reduction is achieved when the amplitude of the individual channel RF waveforms is equal.

Described herein is a method of slice selection which utilizes multiple transmit channels to achieve slice profiles identical to those obtained by conventional single transmit channel slice selective pulses, in the same excitation time, but with dramatic reduction of SAR by a factor up to the number of transmit channels. The transverse component of SAR is reduced by destructive interference of the RF excitation at locations outside the selected slice.

This method is presented for hypothetical coil sensitivity profiles which are constant in amplitude but with linearly varying phase. Such coil sensitivity profiles may be possible with twisted birdcage coil designs.

Figure 12:
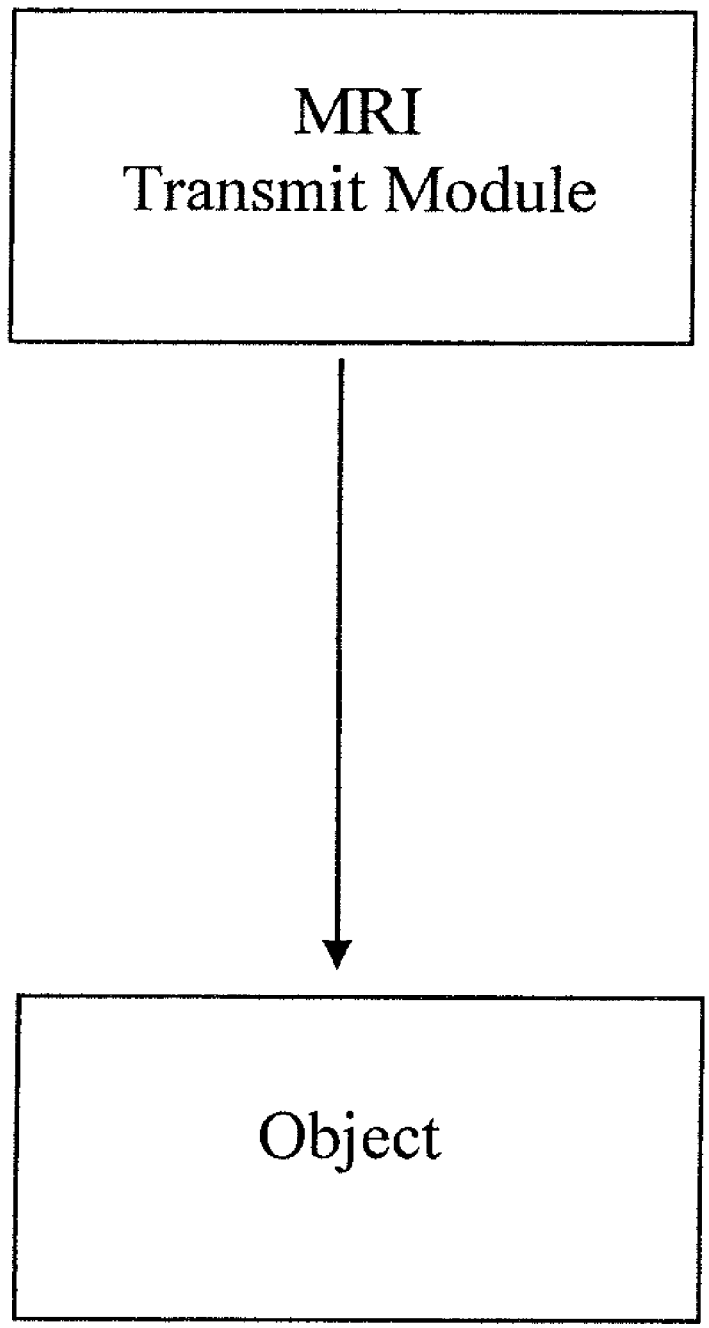
FIG. 12 depicts a schematic representation of an MRI transmit module in accordance with embodiments described herein.

FIG. 12 depicts a system, for reducing a specific absorption rate (SAR) over a field of view of an imaged object during magnetic imaging (MRI), that includes a transmit module. In some embodiments, the transmit module is programmed to emit a first radiofrequency (RF) pulse into an object with an RF excitation coil element that has a first sensitivity profile comprising a first phase that is substantially constant across an imaging volume of the object; emit a second RF pulse into the object with a second RF excitation coil element that has a second sensitivity profile comprising a second phase that varies substantially linearly, with a first nonzero integer multiple of $2\pi$ phase variation, in a direction across the imaging volume; and emit a third RF pulse into the object with a third RF excitation coil element that has a third sensitivity profile comprising a third phase that varies substantially linearly, with a second nonzero integer multiple of $-2\pi$ phase variation, in the direction across the imaging volume. In some embodiments, an improved SAR, resulting from emission of the first, second, and third RF pulses over a field of view of the object, is decreased relative to an unimproved SAR, resulting from emission of a fourth RF pulse that would produce substantially the same amount of transverse magnetization as emission of the first, second, and third RF pulses over the field of view.

Although preferred embodiments of the disclosure have been described in detail, certain variations and modifications will be apparent to those skilled in the art, including embodiments that do not provide all the features and benefits described herein. It will be understood by those skilled in the art that the present disclosure extends beyond the specifically disclosed embodiments to other alternative or additional embodiments and/or uses and obvious modifications and equivalents thereof. In addition, while a number of variations have been shown and described in varying detail, other modifications, which are within the scope of the present disclosure, will be readily apparent to those of skill in the art based upon this disclosure. It is also contemplated that various combinations or subcombinations of the specific features and aspects of the embodiments may be made and still fall within the scope of the present disclosure. Accordingly, it should be understood that various features and aspects of the disclosed embodiments can be combined with or substituted for one another in order to form varying modes of the present disclosure. Thus, it is intended that the scope of the present disclosure herein disclosed should not be limited by the particular disclosed embodiments described above.

What is claimed is:

1. A method, of emitting radio frequency (RF) pulses into an object during magnetic resonance imaging (MRI), comprising:

emitting a first RF pulse into the object with a first RF excitation coil element, wherein the first RF pulse comprises a first RF waveform;

emitting a second RF pulse into the object with a second RF excitation coil element, wherein the second RF pulse comprises a second RF waveform that is time shifted relative to the first RF waveform by $2n\pi/\gamma G$, where G is a gradient strength of a slice-select gradient, $\gamma$ is a gyromagnetic ratio in units of radians per unit gradient strength, and n is an integer; and emitting a third RF pulse into the object with a third RF excitation coil element, wherein the third RF pulse comprises a third RF waveform that is time shifted relative to the first RF waveform by $-2n\pi/\gamma G$.

2. The method of claim 1, wherein RF pulses are emitted into the object by n RF coil elements.

3. The method of claim 2, wherein $n \geq 3$.

4. The method of claim 1, wherein the first, second and third RF waveforms are substantially identical in shape.

5. The method of claim 1, further comprising, after emitting the third RF pulse, detecting an RF signal scattered from the object for generating an MRI image.

6. The method of claim 1, wherein the first RF excitation coil element has a first sensitivity profile comprising a first phase that is substantially constant in a direction across an imaging volume of the object, the second RF excitation coil element has a second sensitivity profile comprising a second phase that varies substantially linearly, with an n multiple of $2\pi$, in the direction across the imaging volume, and the third RF excitation coil element has a third sensitivity profile comprising a third phase that varies substantially linearly, with an n multiple of $-2\pi$, in the direction across the imaging volume.

7. The method of claim 6, wherein the first phase is substantially zero across the imaging volume.

8. The method of claim 6, wherein the sensitivity profile of each of the first, second and third excitation coil elements comprises a substantially uniform amplitude across the imaging volume.

9. A system, for emitting radio frequency (RF) pulses into an object during magnetic resonance imaging (MRI), comprising:

a transmit module, programmed to:

emit a first RF pulse into the object with a first RF excitation coil element, wherein the first RF pulse comprises a first RF waveform;

emit a second RF pulse into the object with a second RF excitation coil element, wherein the second RF pulse comprises a second RF waveform that is time shifted relative to the first RF waveform by $2n\pi/\gamma G$, where G is a gradient strength of a slice-select gradient, $\gamma$ is a gyromagnetic ratio in units of radians per unit gradient strength, and n is an integer; and emit a third RF pulse into the object with a third RF excitation coil element, wherein the third RF pulse comprises a third RF waveform that is time shifted relative to the first RF waveform by $-2n\pi/\gamma G$.

10. The system of claim 9, wherein RF pulses are emitted into the object by n RF coil elements.

11. The system of claim 10, wherein $n \geq 3$.

12. The system of claim 9, wherein the first, second and third RF waveforms are substantially identical in shape.

13. The system of claim 9, further comprising a receive module configured to, after the third RF pulse is emitted, detect an RF signal scattered from the object for generating an MRI image.

14. The system of claim 9, wherein the first RF excitation coil element has a first sensitivity profile comprising a first phase that is substantially constant in a direction across an imaging volume of the object, the second RF excitation coil element has a second sensitivity profile comprising a second phase that varies substantially linearly, with an n multiple of $2\pi$, in the direction across the imaging volume, and the third RF excitation coil element has a third sensitivity profile comprising a third phase that varies substantially linearly, with an n multiple of $-2\pi$, in the direction across the imaging volume.

15. The system of claim 14, wherein the first phase is substantially zero across the imaging volume.

16. The system of claim 14, wherein the sensitivity profile of each of the first, second and third excitation coil elements comprises a substantially uniform amplitude across the imaging volume.

17. A method, of emitting radio frequency (RF) pulses into an object during magnetic resonance imaging (MRI), comprising:
   emitting a first RF pulse into the object with a first RF excitation coil element, wherein the first RF pulse comprises a first RF waveform;
   emitting a second RF pulse into the object with a second RF excitation coil element, wherein the second RF pulse comprises a second RF waveform that is time shifted relative to the first RF waveform by $2n\pi \cos\theta/\gamma G$, where $\theta$ is an angle between a selected slice and an axial plane, G is a gradient strength of a slice-select gradient, $\gamma$ is a gyromagnetic ratio in units of radians per unit gradient strength, and n is an integer; and
   emitting a third RF pulse into the object with a third RF excitation coil element, wherein the third RF pulse comprises a third RF waveform that is time shifted relative to the first RF waveform by $-2n\pi \cos\theta/\gamma G$.

18. The method of claim 17, wherein the first, second and third RF waveforms are substantially identical in shape.

19. The method of claim 17, further comprising, after emitting the third RF pulse, detecting an RF signal scattered from the object for generating an MRI image.

20. The method of claim 17, wherein the first RF excitation coil element has a first sensitivity profile comprising a first phase that is substantially constant in a direction across an imaging volume of the object, the second RF excitation coil element has a second sensitivity profile comprising a second phase that varies substantially linearly, with an n multiple of $2\pi$, in the direction across the imaging volume, and the third RF excitation coil element has a third sensitivity profile comprising a third phase that varies substantially linearly, with an n multiple of $-2\pi$, in the direction across the imaging volume.

* * * * *